(12) United States Patent
Lin

(10) Patent No.: US 10,031,698 B2
(45) Date of Patent: *Jul. 24, 2018

(54) METHOD OF WEAR LEVELING FOR DATA STORAGE DEVICE

(71) Applicant: Silicon Motion, Inc., Jhubei, Hsinchu (TW)

(72) Inventor: Sheng-Liu Lin, Hsinchu (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/785,325

(22) Filed: Oct. 16, 2017

(65) Prior Publication Data

US 2018/0039435 A1    Feb. 8, 2018

Related U.S. Application Data

(63) Continuation of application No. 15/207,456, filed on Jul. 11, 2016, now Pat. No. 9,830,098.

(51) Int. Cl.
| | |
|---|---|
| *G11C 16/04* | (2006.01) |
| *G06F 3/06* | (2006.01) |
| *G11C 16/10* | (2006.01) |
| *G11C 16/34* | (2006.01) |
| *G11C 29/52* | (2006.01) |

(Continued)

(52) U.S. Cl.
CPC .......... *G06F 3/0659* (2013.01); *G06F 3/064* (2013.01); *G06F 3/0616* (2013.01); *G06F 3/0679* (2013.01); *G11C 16/10* (2013.01); *G11C 16/349* (2013.01); *G11C 16/3495* (2013.01); *G11C 29/52* (2013.01); *G11C 29/70* (2013.01); *G11C 2029/0409* (2013.01)

(58) Field of Classification Search
CPC .... G06F 3/0619; G06F 3/0659; G06F 3/0697; G06F 16/10
USPC ....... 365/185.17, 185.11; 711/103, 165, 203, 711/206
See application file for complete search history.

(56) References Cited

U.S. PATENT DOCUMENTS

| | | | | |
|---|---|---|---|---|
| 5,963,474 A | * | 10/1999 | Uno ...................... | G06F 3/0614 365/185.04 |
| 2009/0089485 A1 | | 4/2009 | Yeh | |
| 2011/0238890 A1 | * | 9/2011 | Sukegawa ........... | G06F 12/0246 711/103 |

FOREIGN PATENT DOCUMENTS

| | | |
|---|---|---|
| CN | 100538660 C | 9/2009 |
| CN | 101256535 B | 3/2011 |

(Continued)

*Primary Examiner* — Vu Le
(74) *Attorney, Agent, or Firm* — Li-Jen Shen

(57) ABSTRACT

A method of wear leveling for a data storage device is provided. The data storage device includes a non-volatile memory having a plurality of blocks. A portion of the blocks not having any valid data are defined as spare blocks, and the spare blocks are associated with a spare pool. The method includes the steps of: maintaining a management table recording a plurality of physical block numbers and a plurality of block statuses corresponding to the blocks; selecting a first spare block having a first smallest physical block number as a current temporary block; receiving a write command from a host; determining whether data in the write command shall be written into the current temporary block; if false, selecting a second spare block having a second smallest physical block number as a next temporary block; and writing the data into the next temporary block.

8 Claims, 8 Drawing Sheets

(51) Int. Cl.
  *G11C 29/00* (2006.01)
  *G11C 29/04* (2006.01)

(56) References Cited

FOREIGN PATENT DOCUMENTS

| | | |
|---|---|---|
| CN | 102012867 B | 12/2014 |
| TW | 201324150 A1 | 6/2013 |
| TW | 201337562 A | 9/2013 |
| TW | 201348962 A | 12/2013 |
| TW | 201510722 A | 3/2015 |
| TW | 201511013 A | 3/2015 |

\* cited by examiner

| Physical Block Number | Erase Count | Read Count | Block Status | Timestamp |
|---|---|---|---|---|
| 1 | 50 | | S | |
| 2 | 30 | | S | |
| 3 | 40 | 1K | T | 2016/1/3 |
| 4 | 100 | 5K | D | 2015/1/1 |
| 5 | 20 | 10K | D | 2016/1/1 |
| 6 | 150 | 15K | D | 2016/1/2 |
| 7 | 200 | | S | |

FIG. 3

| Erase Count | Read Count | Block Status | Timestamp |
|---|---|---|---|
| 50 | | S | |
| 30 | | S | |
| 40 | 1K | T | 2016/1/3 |
| 100 | 5K | D | 2015/1/1 |
| 20 | 10K | D | 2016/1/1 |
| 150 | 15K | D | 2016/1/2 |
| 200 | | S | |

FIG. 4

| Physical Block Number | Erase Count | Read Count | Block Status | Timestamp |
|---|---|---|---|---|
| 1 | 50 | | S | |
| 2 | 30 | | S | |
| 3 | 40 | 1K | T | 2016/1/3 |
| 4 | 100 | 5K | D | 2015/1/1 |
| 5 | 21 | | S | |
| 6 | 15 | 15K | D | 2016/1/2 |
| 7 | 200 | 0 | D | 2016/1/1 |

FIG. 6

| Physical Block Number | Erase Count | Read Count | Block Status | Timestamp |
|---|---|---|---|---|
| 1 | 50 | | S | |
| 2 | 30 | | S | |
| 3 | 40 | 1K | T | 2016/1/3 |
| 4 | 101 | | S | |
| 5 | 20 | 10K | D | 2016/1/1 |
| 6 | 150 | 15K | D | 2016/1/2 |
| 7 | 200 | 0 | D | 2015/1/1 |

FIG. 8

METHOD OF WEAR LEVELING FOR DATA STORAGE DEVICE

CROSS-REFERENCE TO RELATED APPLICATION

This application is a continuation of an application Ser. No. 15/207,456, filed on Jul. 11, 2016, and now pending. The entirety of each of the above-mentioned patent applications is hereby incorporated by reference herein and made a part of this specification.

FIELD OF THE INVENTION

The present invention relates to a method of wear leveling for a data storage device, and more particularly to a method of wear leveling for a data storage device having a non-volatile memory (NVM).

BACKGROUND OF THE INVENTION

NVM is an electronic memory device with specific abilities such as maintaining data for a certain time after power off, fast data access and shockproof. Therefore, NVM is widely used in memory cards, solid state drives (SSD) and portable multimedia devices. NVM includes a plurality of blocks for storing data. Specifically, according to the using situation, a block is mainly named either a data block or a spare block. Data block refers to a block stores (valid) data and on contrary a spare block refers to a block does not store valid data. Usually spare blocks are related to a spare pool or a spare queue and data blocks are related to a data pool. A spare block is selected from the spare pool or spare queue to save data from a host and at this stage it is named a temporary block. When the temporary block is filled with data or does not save data anymore, the temporary block is named a data block. A following data is saved to a next temporary block. The above procedure repeats continuously. A wear leveling and garbage collection procedure are disclosed to make the use of the blocks evenly and recycle the data blocks having less valid data individually.

NVM has a serious defect and that is the limitation of erase times. According to the specification of NVM products, different numbers of erase times for different types of NVM is recommended. Taking Flash memory as an example, TLC (Triple-Level Cell) type of Flash is 1K (thousand) but SLC (Single-Level Cell) type of Flash is 100K. If the number of erase times is reached, it means the block is not assumed to work normally. It may be out of work shortly. If blocks of a NVM are not used evenly, some blocks may be out of work at an early stage. In such situation, a fewer block are available to save data. This causes the lifetime of the device shorter than expectation. On the other hand, if blocks can be used evenly by implementing wear leveling procedure, in theory the lifetime of the device is extended obviously. An efficient and prompt wear leveling procedure is desired.

SUMMARY OF THE INVENTION

Accordingly, one objective of the present invention is to provide a method of wear leveling for a data storage device capable of utilizing the blocks evenly and selecting the next temporary block promptly or expeditiously.

The present invention provides a method of wear leveling for a data storage device. The data storage device includes a non-volatile memory, and the non-volatile memory includes a plurality of blocks. A portion of the blocks not having any valid data are defined as spare blocks and the spare blocks are associated with a spare pool. The method includes steps of: maintaining a management table recording a plurality of physical block numbers and a plurality of block statuses corresponding to the blocks; selecting a first spare block having one of the block statuses and a first smallest physical block number as a current temporary block; receiving a write command from a host; determining whether written data in the write command shall be written into the current temporary block; if false, selecting a second spare block having the one of the block statuses and a second smallest physical block number as a next temporary block; and writing the written data into the next temporary block.

The present invention further provides a method of wear leveling for a data storage device. The data storage device includes a non-volatile memory, and the non-volatile memory includes a plurality of blocks. A portion of the blocks not having any valid data are defined as spare blocks. The method includes steps of: assigning one of a plurality of physical block numbers to each of the spare blocks; maintaining a management table recording the physical block numbers; selecting a first spare block from the spare blocks having a first smallest physical block number as a current temporary block; determining whether data from a host shall be written into the current temporary block; if false, selecting a second spare block from the spare blocks having a second smallest physical block number as a next temporary block; and writing the data into the next temporary block.

BRIEF DESCRIPTION OF THE DRAWINGS

Other advantages, objectives and features of the present invention will become apparent from the following description referring to the attached drawings.

FIG. 3 is an exemplary management table recording the physical block number and block status of each block of a NVM 12 of a data storage device 10;

FIG. 4 is a modified management table;

FIG. 6 is the updated management table after the swap procedure;

FIG. 8 is an updated management table.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
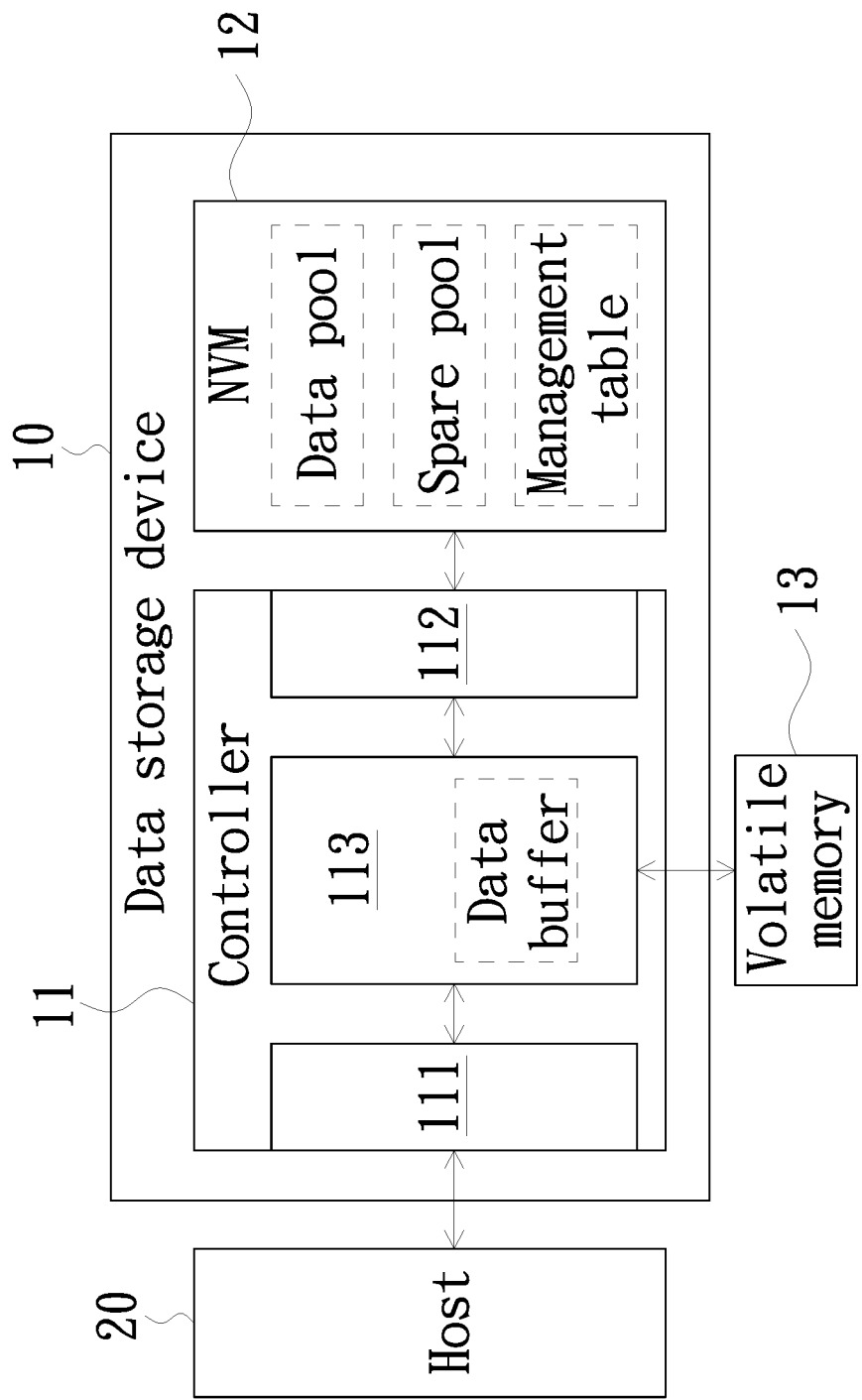
FIG. 1 is a schematic block view of a data storage device in accordance with an embodiment of the present invention.

Please refer to FIG. 1, which is a schematic block view of a data storage device in accordance with an embodiment of the present invention. As shown, the data storage device 10 of the present embodiment is configured to receive a write instruction from an external host 20 and save data retrieve from the write instruction into the data storage device 10.

The host 20 may be an electronic device such as a desktop, a tablet computer, a phone device or a mobile device. The data storage device 10 includes a controller 11 and a non-volatile memory (NVM) 12. The NVM 12 is preferable a flash memory. The controller 11 is electrically coupled to the host 20 and the NVM 12. The controller 11 includes a first communication interface 111, a second communication interface 112 and a microprocessor 113. The microprocessor 113 is electrically coupled to the first communication interface 111 and the second communication interface 112. The controller 11 is in communication with the host 20 via the first communication interface 111 so as to receive the aforementioned write instruction. The controller 11 is further in communication with the NVM 12 via the second communication interface 112 so as to access the NVM 12. The first communication interface 111 may be serial advanced technology attachment (SATA), universal serial bus (USB), peripheral component interconnect express (PCI Express), universal flash storage (UFS), embedded Multi-Media card (eMMC), secure digital input/output (SDIO), mSATA (mini-SATA) or M.2 (formally named next generation form factor). In one embodiment, the second communication interface 112 may be open NAND flash interface (ONFI) or Toggle. Further, the data storage device 10 preferably includes a volatile memory 13, such as DRAM, to act as a data buffer to hasten the processing of write instruction(s).

Figure 2:
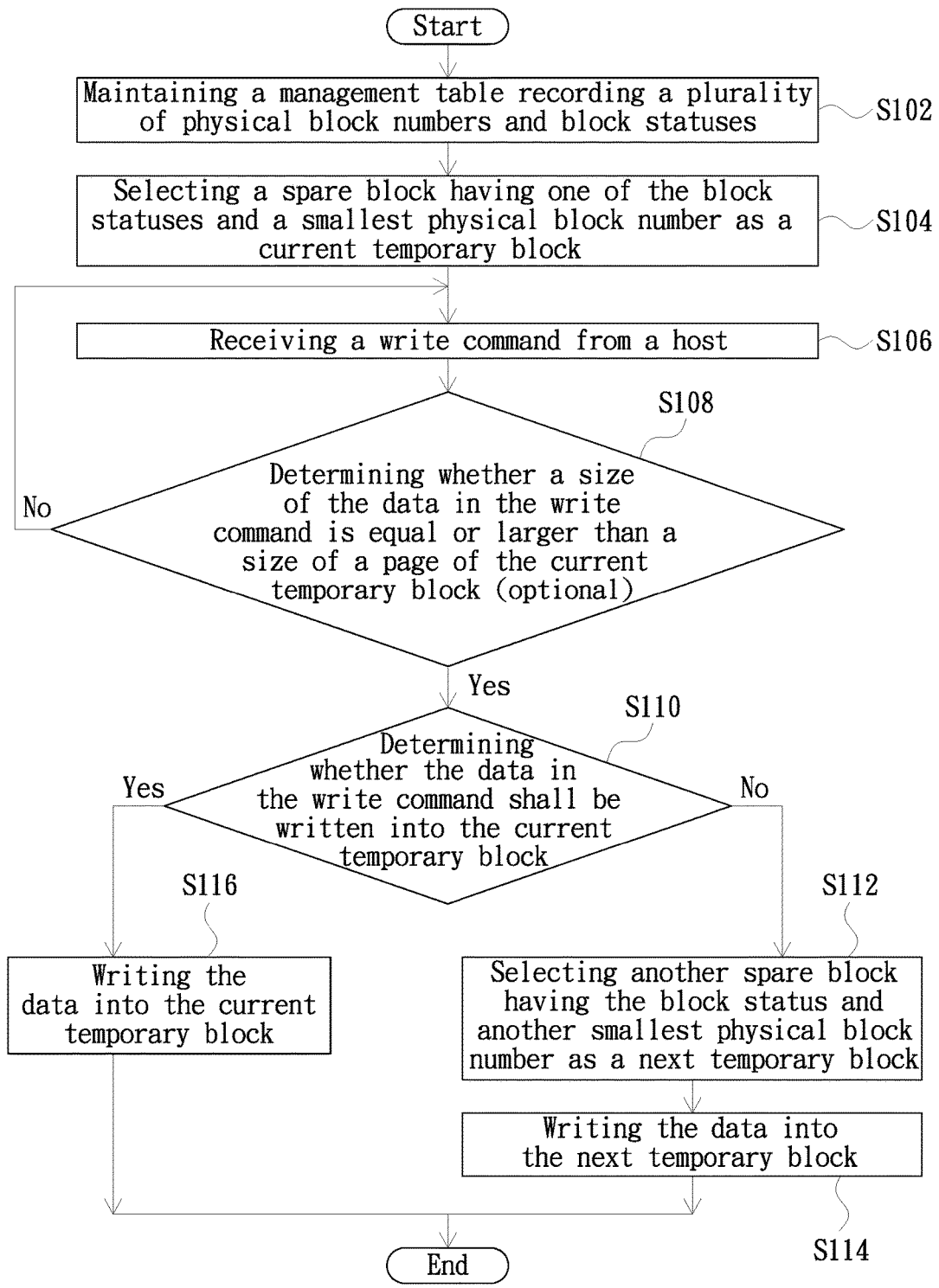
FIG. 2 is a procedure of dynamic wear leveling in accordance with an embodiment of the present invention.

As shown in FIG. 2, a procedure of dynamic wear leveling in accordance with an embodiment of the present invention is disclosed. The procedure of dynamic wear leveling of the present invention is used preferably in the data storage device 10. In step S102, a management table recording a plurality of physical block numbers and block statuses is maintained. The plurality of physical block numbers are referred to as the entries or sequence numbers of the blocks in the management table. When the data storage device 10 is powered on, an initialization procedure starts and assigns a physical block number and block status to each of the blocks to generate the management table. The management table is generated and maintained by the controller 11 and remained saved in the NVM 12. During the operation, the block status is changed to indicate a current status of a block. For instance, a block is currently a spare block, temporary block or data block. The controller 11 copies the management table to the volatile memory 13 or a data buffer in the controller 11 in order to maintain and update the table efficiently and expeditiously. When the procedure of dynamic wear leveling of the present invention starts, the management table recording the physical block numbers and block statuses is maintained by the controller 11. Maintenance means the controller 11 keeps the content of the table updated and saves a copy of the table into the NVM 12 periodically or when an abnormal event happens. Abnormality means an unexpected or exceptional event rises. For example, when a system power is off suddenly. Sometimes the host 10 sends an interrupt to the controller 11 to reflect an abnormal event. Sometimes it is the controller 11 to detect an abnormal event. When an abnormal event is detected/received, the control 11 leaves a normal mode and enters into an emergency mode.

FIG. 3 is an exemplary management table recording the physical block numbers and block statuses of blocks in a NVM 12 of a data storage device 10. Moreover, this table also records a plurality of erase counts, read counts, and timestamps. It is merely an example that the table records a physical block number, block status, erase count, read count and timestamp for each of the blocks in the NVM 12. In reality there may be over thousands of blocks in a NVM 12; in order to simplify the description, seven blocks are illustrated in FIG. 3, but the present invention is not limited thereto. The first and second blocks, whose physical block numbers are 1 and 2, are spare blocks (block status marked as "S") and have been erased for 50 and 30 times respectively. Because no data is saved, the timestamp is void or can be recorded as 00h or FFh (but is not limited thereto). The third block, having a physical block number of 3, has been selected as a temporary block (marked as "T"); the data from the host 20 is supposed to be written into this block The third block was a spare block (not shown in figures) before saving the first record of data on 2016/1/3. The fourth, fifth and sixth blocks, having physical block numbers of 4, 5 and 6, are data blocks (block status marked as "D") and have been erased for 100, 20 and 150 times respectively. Their first records of data in these blocks were saved on 2015/1/1, 2016/1/1 and 2016/1/2 respectively. The seventh block, having a physical block number of 7, is also a spare block.

Please be noted that the column of physical block number can be omitted if the management table is not re-sorted. In other words, the content of the management table is not re-sorted based on any column. All of the updates are inserted into their corresponding locations/addresses. In this situation, the controller 11 can determine a physical block number according to the locations/addresses of the cells of the management table. For example, FIG. 4 is a modified management table of the management table shown in FIG. 3 with the column of physical block number being removed. In this modified management table the first column records the erase counts of blocks. The controller 11 determines that locations/addresses 0, 1, 2 and 3 corresponds to the erase count, read count, block status and timestamp of the first block; locations/addresses 4, 5, 6 and 7 corresponds to the erase count, read count, block status and timestamp of the second block; locations/addresses 8, 9, 10 and 11 corresponds to the erase count, read count, block status and timestamp of the third block, etc. Hence, the physical block number is disclosed in the table inherently or implicitly. In other words, the management table can record or disclose the physical block numbers in an explicit or implicit manner.

In step S104, the controller 11 selects a spare block having a block status of "S" and the smallest physical block number as a current temporary block. There are several selection criteria for selecting a spare block as the current temporary block. For example, the first may be that the controller 11 selects a spare block having the smallest physical block number from the spare pool as the next temporary block directly. The second may be that the controller 11 selects a spare block having the smallest physical block number from a spare queue as the next temporary block directly. The spare queue refers to some of the spare blocks arranged in a queue of candidates of the current temporary block. For example, if there are 300 spare blocks, 30 out of the 300 spare blocks may be arranged in a queue and the rest are associated with the spare pool. The third may be that the controller 11 first excludes all of the spare blocks whose erase counts are higher than a threshold, for example 200, and selects a spare block having the smallest physical block number as the current temporary block. The fourth may be that the controller 11 selects blocks having the top three smallest physical block numbers as a group and selects one block from the group randomly as the current temporary block. Under the first selection method, the third block in FIG. 3 is selected as the current temporary block for it having the spare block status (not shown in figures) and a smallest physical block number.

In step S106, the controller 11 receives a write command from a host 20. The host 20 complies with the specification of the first communication interface 111 and sends a write command to the controller 11. The write command includes a (written) data and a corresponding address. The corresponding address is preferably a LBA (logical block address). The write command may further include a metadata, such as creation time or time of last modification, etc. The controller 11 records the date or time of receiving the write command as a write time and saves it into the timestamp column in the management table. Due to different mechanisms of data management, the data may not be written into the current temporary block immediately. For example, in a first mechanism of data management, data would not be written into the temporary block until the data volume reaches or surpasses a threshold. For example, the controller 11 determines whether the size of the data in the write command is equal to or larger than a size of a page of the current temporary block (step S108). In a second mechanism of data management, data is written into the current temporary block right away. Both mechanisms have their benefits and disadvantages and are well-known in the art, so detailed description is omitted herein.

In step S110, the controller 11 determines whether data in the write command shall be written into the current temporary block. If the result of step S110 is false, step S112 is executed. Otherwise, step S116 is executed. The current temporary block is supposed to save data continuously. However, in some cases, the current temporary block does not save data anymore. For example, the current temporary block is already filled with data and has become a data block; or the current temporary block is closed and does not save any more data for data management purposes. In either of these cases, the controller 11 would determine that the data shall be written into another temporary block. In order to distinguish from the current temporary block, another temporary block is referred to as a next temporary block.

In step S112, the controller 11 selects another spare block having the block status of "S" and another smallest physical block number as a next temporary block. As shown in FIG. 3, there are three spare blocks available. Their physical block numbers are 1, 2 and 7. Because 1 is the smallest among the three numbers, the first block would be selected as the next temporary block. Of course, in a different mechanism, it is possible that the second block, rather than the first block, is selected as the next temporary block. In the case where the first block is the current temporary block but is unable to save data anymore, either the second or the seventh block would be selected as the next temporary block in step S112. Because the management table is not re-sorted, the controller 11 can always select the next temporary block promptly or expeditiously. No complicated comparison procedure, such as comparing the difference between erase counts, read counts, timestamps or the likes, is executed. Hence, the dynamic wear leveling of the present invention provides a better performance over the prior art.

In step S114, the controller 11 write the data into the next temporary block and eventually the procedure of the dynamic wear leveling of the present invention is ended. In step S116, the data is written into the current temporary block and eventually the procedure of the dynamic wear leveling of the present invention is ended.

Figure 5:
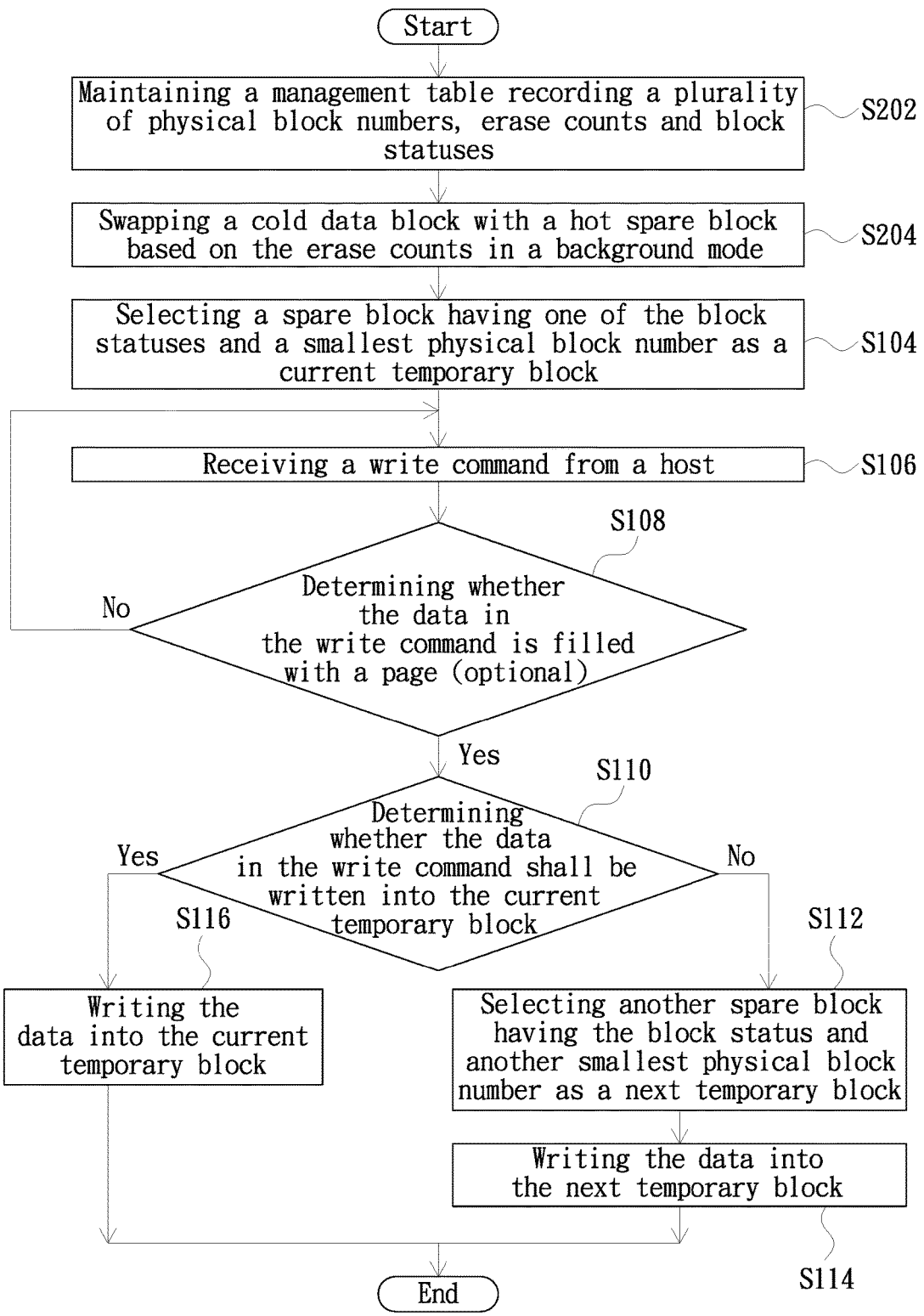
FIG. 5 is a procedure of wear leveling in accordance with a first embodiment of the present invention.

In order to utilize the blocks in the NVM 12 evenly, a method of wear leveling in accordance with the first embodiment of the present invention is also disclosed. Please refer to FIG. 5. Please be noted that the method of wear leveling of the present invention is similar to the method of dynamic wear leveling of the present invention. The steps using the same notations refer to the same steps.

In step S202, a management table recording a plurality of physical block numbers, erase counts and block statuses is generated. Similar to step S102, step 202 further records a plurality of erase counts of the blocks.

In step S204, the controller 11 swaps a cold data block with a hot spare block in a background mode. A hot block refers to a block having a large erase count, and a hot spare block refers to a spare block having a large erase count. Hot blocks may be defined as a single block or a group of hot blocks having erase counts higher than a hot threshold, such as 100. In the later case, one block can be chosen from the group of hot blocks randomly or the extreme is chosen directly. Similarly, a cold block refer to a block having a small erase count, and a cold data block refers to a data block having a small erase count. A single block or a group of blocks may be defined as cold blocks if their erase counts are lower than a cold threshold, such as 30. In the later case, one block can be chosen from the group of blocks randomly or the extreme is chosen directly. When receiving commands from the host 20, the controller 11 is operated under a foreground mode and may respond to the commands immediately. When the controller 11 does not receive any command from the host 20 for a certain period, such as 1 second, the controller 11 is switched into a background mode. In the background mode, the controller 11 does not operate directly in response to any command from the host 20 but would execute certain tasks, such as static wear leveling or garbage collection, for data management purposes. Taking the management table in FIG. 3 as an example, after entering the background mode in step S204, the controller 11 determines that the fifth block is a cold data block because its erase count is lower than the cold threshold and is marked as "D". It also determines that the seventh block is a hot spare block because its erase count is higher than the hot threshold and is marked as "S". When the cold data block and hot spare blocks are selected or determined, the controller 11 runs a swap procedure on these two blocks. The swap procedure refers to copying or moving saved data from the cold data block to the hot spare block. As shown in the updated management table in FIG. 6, when the swap procedure is completed, the cold data block in the fifth block become a spare block and the block status is re-marked as "S". Similarly, the hot spare block in the seventh block become a data block and the block status is re-marked as "D". Moreover, data related information, such as timestamp, is also swapped, and irrelevant information, such as read count, is reset during the swap procedure. Of course, during the swap procedure only valid data is copied or moved. Last, the erase count of the new spare block, i.e., the fifth block, is incremental, adding one count right after the swap procedure is completed. The erase count may also be added at a later time point but before the corresponding block being selected as a temporary block. It is up to the actual need of the user.

In an alternative embodiment, the controller 11 first calculates the erase count differences between the coldest data block and the hottest spare block before executing the step S204. The coldest and hottest blocks are the extremes of cold blocks and hot blocks respectively. The step S204 is executed only if certain condition is met. For example, only when the difference in erase count between the coldest data block, such as the fifth data block shown in FIG. 3, and hottest spare block, such as the seventh data block shown in FIG. 3, is larger than a count threshold, such as 100, the controller 11 would execute the step S204. Since the remaining steps are identical to those in the method of dynamic wear leveling of the present invention, the description is omitted.

Figure 7:
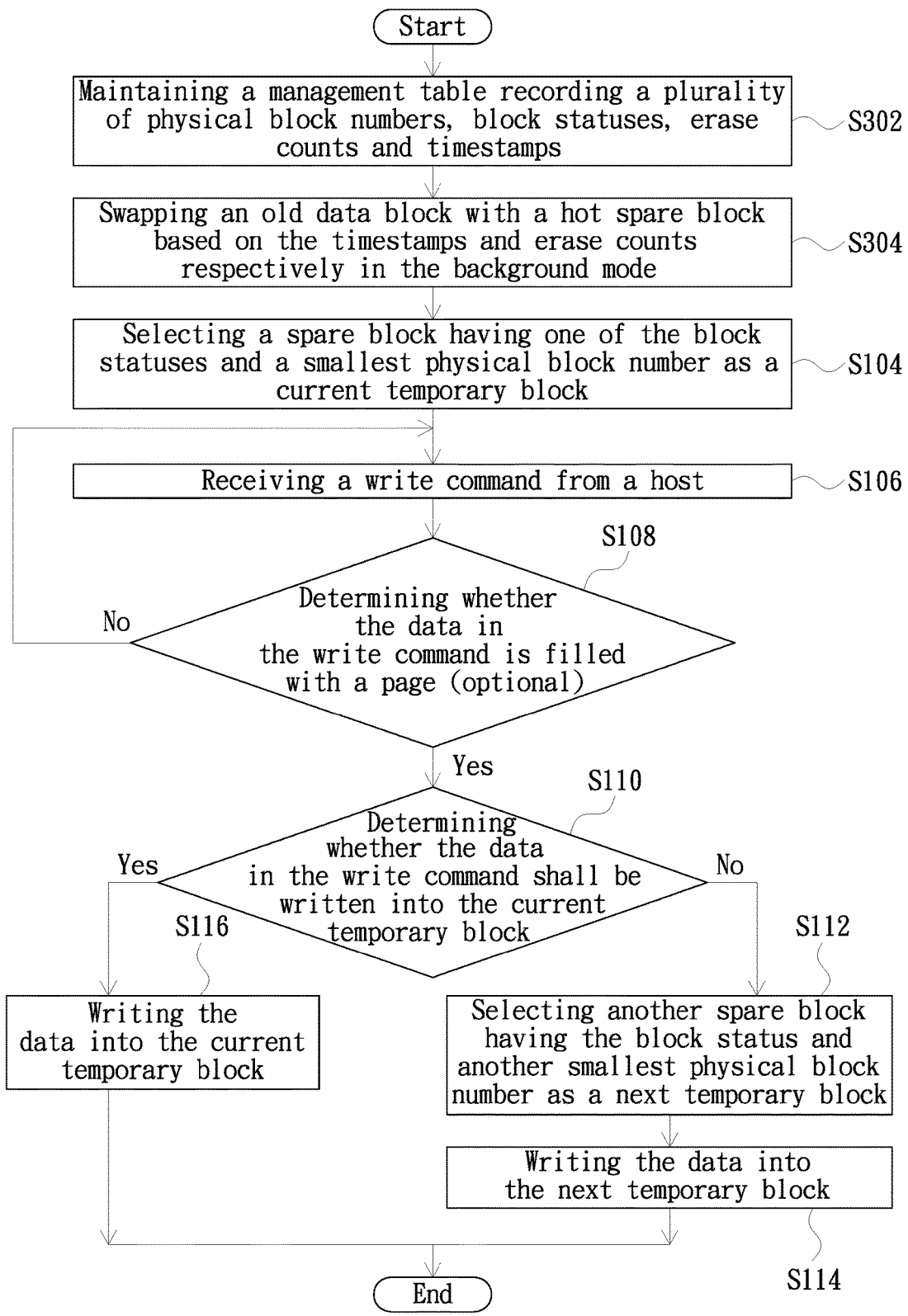
FIG. 7 is a procedure of wear leveling in accordance with a second embodiment of the present invention.

In order to utilize the blocks in the NVM 12 evenly, a method of wear leveling in accordance with a second embodiment of the present invention is also disclosed. Please refer to FIG. 7. Please be noted that the method of wear leveling of the present invention is similar to the method of dynamic wear leveling of the present invention. The steps using the same notations refer to the same steps. In step S302, a management table recording a plurality of physical block numbers, erase counts, block statuses and timestamps is generated. Similar to step S202, step 302 further records a plurality of timestamps.

In step S304, the controller 11 swaps an old data block with a hot spare block in the background mode. An old data block refers to a data block having an old timestamp. A single data block or a group of data blocks may be defined as old data blocks if their timestamps are older than a default time point, such as 2016/1/1. In the later case, one block can be chosen from the group of blocks randomly or the extreme is chosen directly. Taking the management table in FIG. 3 as an example, after entering the background mode, the controller 11 determines that both the fourth and fifth blocks are old data blocks because their timestamps are older than the default time point and are marked as "D". Preferably, the fourth block is chosen as the old data block since it is the older one between the two blocks. On the other hand, preferably the seventh block is chosen as the hot spare block. When a group of blocks are defined as the old data blocks or hot spare blocks, the controller 11 may select any one of the blocks from the group randomly or select the extreme directly. When the old data block and hot spare block are selected, the controller 11 runs a swap procedure on these two blocks. FIG. 8 shows the updated management table after the swap procedure.

In an alternative embodiment, the controller 11 calculates the erase count difference between the oldest data block and the hottest spare block before executing the step S304. The step S304 is executed only if certain condition is met. For example, only when the difference in erase counts between the oldest data block, such as the fourth block shown in FIG. 3, and the hottest spare block, such as the seventh block shown in FIG. 3, is larger than the count threshold, i.e., 100, the controller 11 would execute the step S304. Since the remaining steps are identical to the first embodiment, the description is omitted.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of managing a plurality of spare blocks in a data storage device, the method comprising steps of:
    maintaining a management table recording a plurality of physical block numbers of the spare blocks;
    selecting a first block out of the spare blocks having a smallest physical block number recorded in the management table as a temporary block;
    saving a plurality of data from a host into the temporary block;
    making a determination of whether the temporary block shall be closed;
    if the determination is positive, selecting a second block out of the rest spare blocks having a smallest physical block number recorded in the management table to replace the temporary block; and
    saving the data from the host into the temporary block.

2. The method according to claim 1, wherein the physical block number of the first block is smaller than the physical block number of the second block.

3. The method according to claim 1, wherein the first and second blocks are randomly selected from a group of the spare blocks having the smallest physical block numbers.

4. The method according to claim 1, further comprising a step of closing the first block as a data block.

5. A method of managing a plurality of spare blocks in a data storage device, the method comprising steps of:
    maintaining a management table recording a plurality of physical block numbers of the spare blocks;
    selecting a first block out of the spare blocks having a smallest physical block number recorded in the management table as a temporary block;
    requesting to save a plurality of data into the temporary block;
    making a determination of whether the temporary block shall be closed;
    if the determination is positive, selecting a second block out of the rest spare blocks having a smallest physical block number recorded in the management table to replace the temporary block; and
    requesting to save the data into the temporary block.

6. The method according to claim 5, wherein the physical block number of the first block is smaller than the physical block number of the second block.

7. The method according to claim 5, wherein the first and second blocks are randomly selected from a group of the spare blocks having the smallest physical block numbers.

8. The method according to claim 5, further comprising a step of closing the first block as a data block.

* * * * *